United States Patent
Hu et al.

(10) Patent No.: US 10,438,907 B2
(45) Date of Patent: Oct. 8, 2019

(54) WIRELESS PACKAGE WITH ANTENNA CONNECTOR AND FABRICATION METHOD THEREOF

(71) Applicant: CYNTEC CO., LTD., Hsinchu (TW)

(72) Inventors: Chun-Fu Hu, Hsinchu (TW); Chih-Yu Hu, Hsinchu (TW); Shu-Wei Chang, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 15/375,146

(22) Filed: Dec. 11, 2016

(65) Prior Publication Data

US 2018/0166404 A1   Jun. 14, 2018

(51) Int. Cl.
| | |
|---|---|
| *H01L 23/66* | (2006.01) |
| *H01L 23/498* | (2006.01) |
| *H01L 23/31* | (2006.01) |
| *H01L 23/552* | (2006.01) |
| *H01L 21/56* | (2006.01) |
| *H01L 23/50* | (2006.01) |

(52) U.S. Cl.
CPC ............ *H01L 23/66* (2013.01); *H01L 21/565* (2013.01); *H01L 23/3128* (2013.01); *H01L 23/49811* (2013.01); *H01L 23/49838* (2013.01); *H01L 23/50* (2013.01); *H01L 23/552* (2013.01); *H01L 2223/6605* (2013.01); *H01L 2223/6677* (2013.01); *H01L 2224/16227* (2013.01); *H01L 2224/16238* (2013.01); *H01L 2224/32225* (2013.01); *H01L 2224/73204* (2013.01); *H01L 2224/97* (2013.01); *H01L 2924/15311* (2013.01); *H01L 2924/19105* (2013.01); *H01L 2924/3025* (2013.01)

(58) Field of Classification Search
CPC ................ H01L 23/66; H01L 23/3128; H01L 23/49838; H01L 23/522
USPC .................. 257/659, 698, E23.011, E23.116
See application file for complete search history.

(56) References Cited

U.S. PATENT DOCUMENTS

| | | | |
|---|---|---|---|
| 6,104,087 A * | 8/2000 | DiStefano | H01L 21/4839 257/690 |
| 7,898,066 B1 | 3/2011 | Scanlan | |
| 8,199,518 B1 * | 6/2012 | Chun | H01L 23/49811 361/767 |
| 2014/0239492 A1 * | 8/2014 | Fujii | H01L 23/49811 257/737 |
| 2016/0172317 A1 * | 6/2016 | Tsai | H01L 23/66 257/428 |

(Continued)

FOREIGN PATENT DOCUMENTS

CN      101615601 A      12/2009

*Primary Examiner* — Robert T Huber
(74) *Attorney, Agent, or Firm* — Winston Hsu (57) ABSTRACT

The present invention discloses a wireless package with a resilient connector for connecting a substrate to an antenna. The antenna is disposed directly on a top surface of a molding compound of the wireless package. The resilient connector has a lower terminal bonded to the substrate, a horizontal contact portion, and an oblique support portion integrally extending between the horizontal contact portion and the lower terminal. The horizontal contact portion has a flat top surface that is coplanar with the top surface of the molding compound and is in direct contact with the antenna such that the contact resistance distribution is concentrated and the production yield of the wireless package is improved.

14 Claims, 11 Drawing Sheets

(56) References Cited

U.S. PATENT DOCUMENTS

2016/0351525 A1 12/2016 Chun

* cited by examiner

WIRELESS PACKAGE WITH ANTENNA CONNECTOR AND FABRICATION METHOD THEREOF

BACKGROUND OF THE INVENTION

1. Field of the Invention

The present invention relates generally to the field of semiconductor packaging. More particularly, the present invention relates to a wireless package and a fabrication method thereof.

2. Description of the Related Art

Antenna on Package (AoP) is known in the art. Conventionally, a chip, e.g. an RFIC chip and SMD jumper devices are mounted on a top surface of a package substrate. After molding, a laser drill process is performed to form a via opening in the molding compound and partially expose a surface of each SMD jumper device. The via opening is then filled with a metal paste such as copper paste, thereby forming a metal via on the SMD jumper device. An antenna is then printed on the molding compound and is electrically connected to the SMD jumper device through the metal via.

Ideally, a Cu—Ni—Sn alloy is formed at the interface between the metal via and the SMD jumper device. However, the laser drill process often damages the Sn layer of the SMD jumper devices, or otherwise the Sn layer of the SMD jumper devices may be oxidized during the laser drill process, resulting in weak bonding between Sn and Cu, and therefore the resistance of the wireless package product is not stable. Larger deviation of the contact resistance distribution results in low yield of manufacturing. Further, as the size of the package shrinks, the dimension of the via opening also shrinks. It becomes more and more difficult to completely fill up the via opening with the copper paste due to the limitation of via filling ability of the printing process.

SUMMARY OF THE INVENTION

It is one object of the invention to provide an improved wireless package in order to solve the above-mentioned prior art shortcomings and problems.

According to one aspect, a wireless package is disclosed. The wireless package includes a package substrate, at least one radio-frequency integrated circuit (RFIC) chip, at least one resilient connector, a molding compound encapsulating the at least one RFIC chip, the at least one resilient connector, and the top surface of the package substrate, and an antenna disposed on a top surface of the molding compound. The resilient connector has a terminal bonded to a pad on the top surface of the package substrate, a horizontal contact portion, and an oblique support portion being integrally coupled to the horizontal contact portion and extending between the horizontal contact portion and the terminal. The antenna is in direct contact with the horizontal contact portion.

According to another aspect, a method of fabricating a wireless package is disclosed. A package substrate is provided. A RFIC chip is mounted on the package substrate. A resilient connector is mounted on the top surface of the package substrate. The resilient connector has a terminal bonded to a bond pad on the top surface of the package substrate, a horizontal contact portion, and an oblique support portion being integrally coupled to the horizontal contact portion and extending between the horizontal contact portion and the terminal. A molding process is performed to encapsulate the RFIC chip and the resilient connector with a molding compound. The molding compound has a top surface that is substantially flush with a top surface of the horizontal contact portion. An antenna is formed on the molding compound. The antenna is in direct contact with the top surface of the horizontal contact portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 10 to FIG. 12 are schematic layout diagrams of the wireless package in different layers, wherein

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The term "horizontal" as used herein is defined as a plane parallel to the conventional major plane or surface of the semiconductor chip or substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Figure 4:
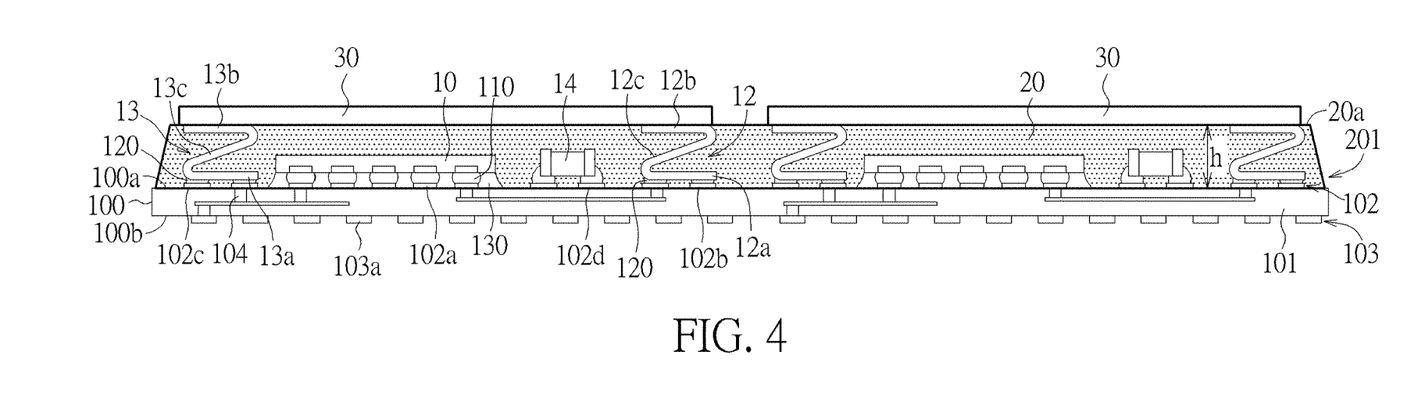
Figure 5:
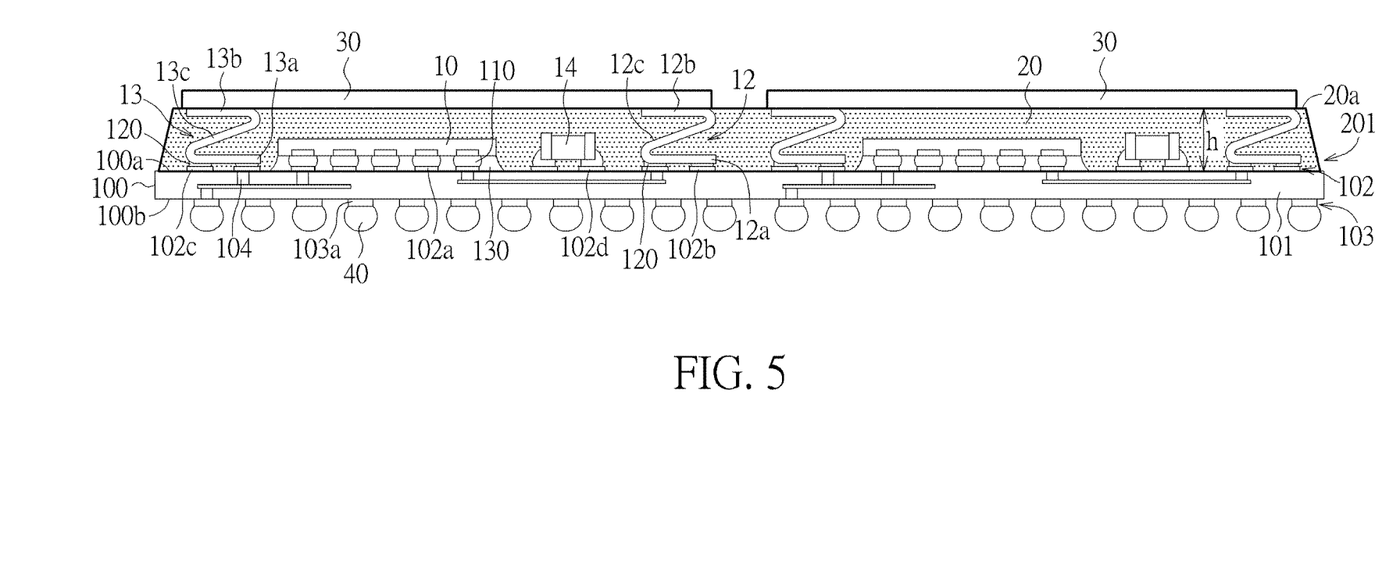
Figure 6:
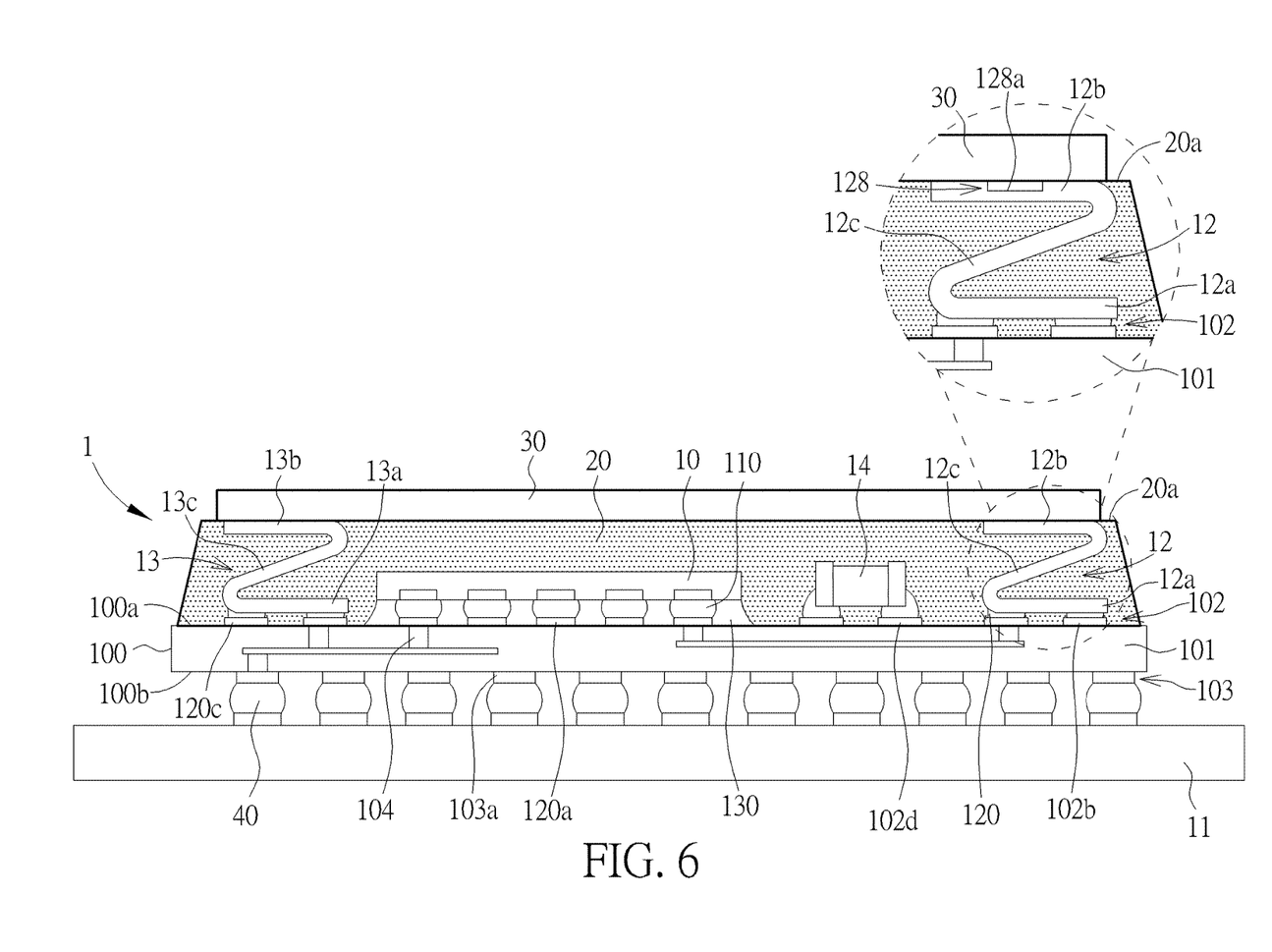
FIG. 6 illustrates a sectional view of wireless package mounted on a system board according to one embodiment of the invention.

Please refer to FIG. 1 to FIG. 6. FIG. 1 to FIG. 5 are schematic, cross-sectional diagrams showing a method of fabricating a wireless package according to one embodiment of the invention. FIG. 6 illustrates a sectional view of wireless package mounted on a system board according to one embodiment of the invention.

Figure 1:
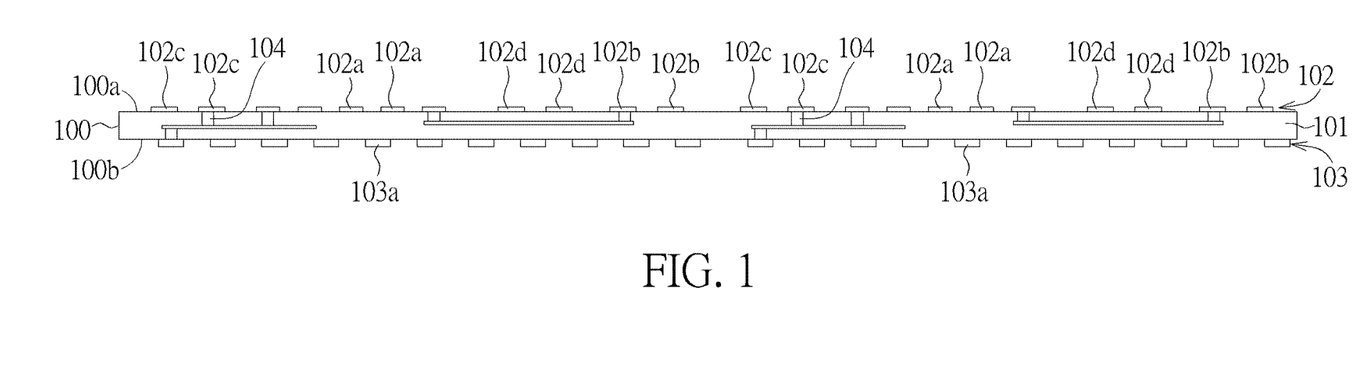
FIG. 1 to FIG. 5 are schematic, cross-sectional diagrams showing a method of fabricating a wireless package according to one embodiment of the invention.

As shown in FIG. 1, a package substrate 100 such as a ball grid array (BGA) packages is provided. The package substrate 100 has a top surface 100a and a bottom surface 100b. For example, the package substrate 100 may include, but not limited to, a core insulative sheet 101, a first patterned metal layer 102 on the top surface 100a, a second patterned metal layer 103 on the bottom surface 100b, and a plurality of vias 104 electrically connected to the first patterned metal layer 102 and the second patterned metal layer 103. The first patterned metal layer 102 may comprise contact pads (or bond pads) 102a, 102b, 102c, and 102d. The second patterned metal layer 103 may comprise ball pads 103a such as ball grid array (BGA) pads, but is not limited thereto.

In an embodiment, the package substrate 100 further includes at least one middle patterned metal layer between the first patterned metal layer 102 and the second patterned metal layer 103 to electrically connected to the plurality of vias 104, the first patterned metal layer 102, and the second patterned metal layer 103 to interconnect element mount on the package substrate 100.

Figure 2:
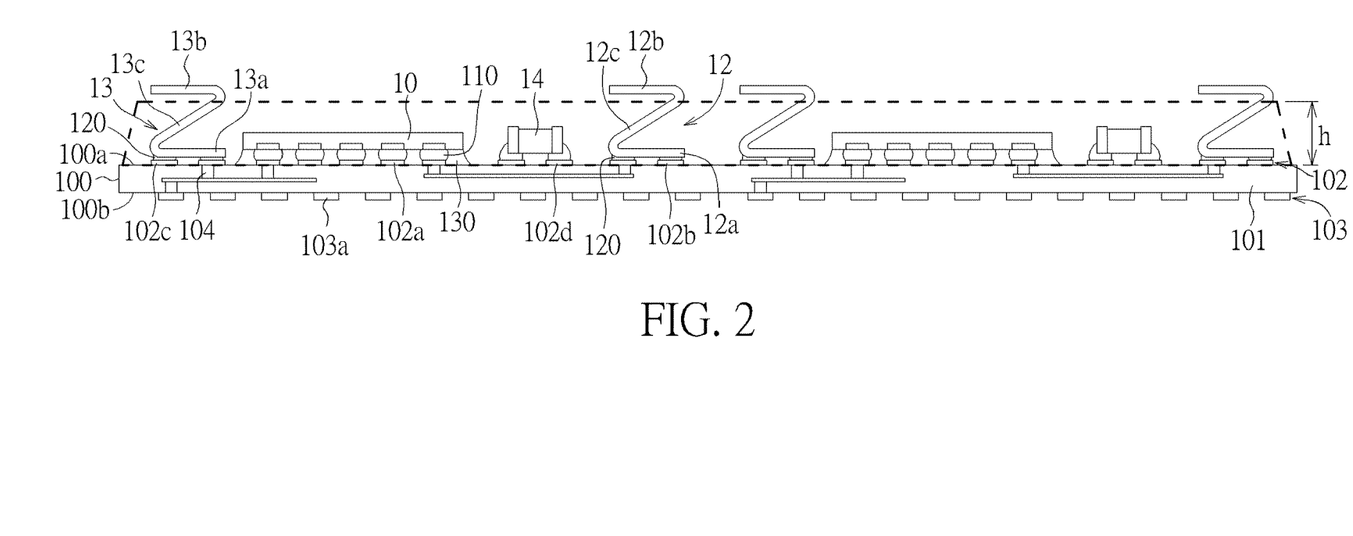

As shown in FIG. 2, a radio-frequency integrated circuit (RFIC) chip 10 is mounted onto the top surface 100a of the package substrate 100. According to the embodiment, the RFIC chip 10 is electrically connected to the contact pads 102a arranged within a chip mounting area of the top surface 100a through connecting elements 110 such as bumps or solder balls. According to the embodiment, the RFIC chip 10 is a flip chip with its active surface facing downward to the top surface 100a of the package substrate 100.

In an embodiment, the RFIC chip 10 may be a bare die or a packaged die. It is understood that the RFIC chip 10 may be mounted to the package substrate 100 by using wire bonding, flip-chip bonding, or any suitable methods. According to the embodiment, the RFIC chip 10 may include, but not limited to, Bluetooth circuitry, Wi-Fi circuitry, a baseband processor, or a medium access control (MAC) chip.

According to the embodiment, after mounting the RFIC chip 10 on the top surface 100a of the package substrate 100, an underfill forming process is carried out. An underfill 130 may be formed between the RFIC chip 10 and the package substrate 100 to surround and secure the connecting elements 110.

Still referring to FIG. 2, a resilient connector 12 and a resilient connector 13 are mounted on the top surface 100a of the package substrate 100 by using surface mount technique (SMT). For example, the resilient connector 12 and the resilient connector 13 may be bonded to the corresponding contact pads 102b and 102c with solder 120. According to the embodiment, the resilient connector 12 and the resilient connector 13 have a Z shaped cross-sectional profile and function as a jumper.

According to the embodiment, the resilient connectors 12, 13 are made of a metal in a monolithic piece. For example, resilient connectors 12, 13 are made of a metal comprising copper or copper alloy. According to the embodiment, nickel and tin may be plated on the resilient connectors 12, 13. By forming the plated interface between terminal of the antenna 30 and the top surface of the horizontal contact portion 12b of the resilient connectors 12, 13 comprising nickel and tin alloy in advance, the subsequent module forming process can be simplified.

The Z shaped resilient connector 12 has a lower terminal 12a bonded to the corresponding contact pads 102b disposed within a predetermined region on the top surface 100a of the package substrate 100, a horizontal contact portion 12b, and an oblique support portion 12c being integrally coupled to the horizontal contact portion 12b and extending between the horizontal contact portion 12b and the lower terminal 12a. According to the embodiment, the lower terminal 12a may be bonded to the corresponding contact pads 102b through a solder 120 such as tin or tin alloy.

Likewise, the Z shaped resilient connector 13 has a lower terminal 13a bonded to the corresponding contact pads 102c disposed within a predetermined region spaced apart from the resilient connector 12 on the top surface 100a of the package substrate 100, a horizontal contact portion 13b, and an oblique support portion 13c being integrally coupled to the horizontal contact portion 13b and extending between the horizontal contact portion 13b and the lower terminal 13a. According to the embodiment, the lower terminal 13a may be bonded to the corresponding contact pads 102c through a solder 120 such as tin or tin alloy.

It is understood that other sectional shapes of the resilient connectors may be used. For example, the resilient connectors may have a C shaped cross-sectional profile, Π shaped cross-sectional profile, Ω shaped cross-sectional profile, or a Σ shaped cross-sectional profile in another embodiment.

Figure 7:
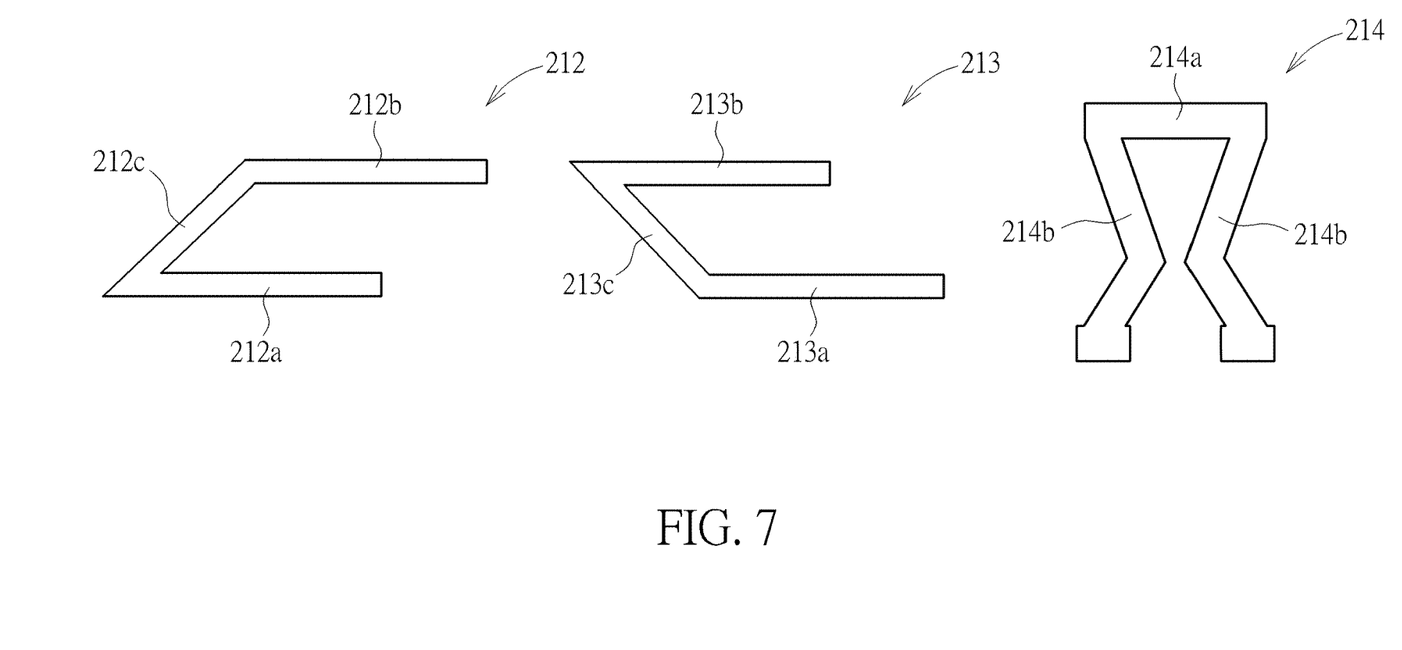
FIG. 7 illustrates two exemplary C shaped resilient connectors and an exemplary Π shaped resilient connector according to various embodiments of the invention.

For example, in FIG. 7, two C shaped resilient connectors 212 and 213 are shown. Likewise, each of the C shaped resilient connectors 212 and 213 has a lower terminal 212a, 213a that can be bonded to the corresponding contact pads disposed within a predetermined region on the top surface 100a of the package substrate 100, a horizontal contact portion 212b, 213b, and an oblique support portion 212c, 213c being integrally coupled to the horizontal contact portion 212b, 213b and extending between the horizontal contact portion 212b, 213b and the lower terminal 212a, 213a. When viewed from the above, the horizontal contact portion 212b, 213b is misaligned with the lower terminal 212a, 213a.

In FIG. 7, an exemplary Π shaped resilient connector 214 is shown. The exemplary Π shaped resilient connector 214 has a horizontal contact portion 214a with a width of about 0.5 mm~2 mm. Two inwardly bent legs 214b are integrally coupled to the horizontal contact portion 214a. The monolithic structure of the exemplary Π shaped resilient connector 214 as shown in FIG. 7 can present stable resistance when deformation occurs.

The dashed line as depicted in FIG. 2 indicates a molding compound to be formed on the top surface 100a of the package substrate 100 in a later stage. The molding compound to be formed on the top surface 100a of the package substrate 100 has a target height h. According to the embodiment, when no pressure or downward force is exerted on the resilient connectors 12, 13, the resilient connectors 12, 13 are slightly higher than the target height h. For example, as can be seen in FIG. 2, the horizontal contact portion 12b and the horizontal contact portion 13b are higher than the target height h.

By providing such configuration, the top surfaces of the horizontal contact portion 12b and the horizontal contact portion 13b can be in direct contact with an upper mold die during the molding process. This ensures that the top surfaces of the horizontal contact portion 12b and the horizontal contact portion 13b do not covered with the molding compound.

Furthermore, according to the embodiment, a passive device 14 may be mounted on the top surface 100a of the package substrate 100 by SMT methods. The passive device 14 may comprise a capacitor, a resistor, or an inductor, but is not limited thereto. For example, the passive device 14 may be electrically connected to the contact pads 102d using solder such as tin or tin alloy. According to one embodiment, the passive device 14 may be coupled to the RFIC chip 10 to form a wireless circuit.

Figure 9:
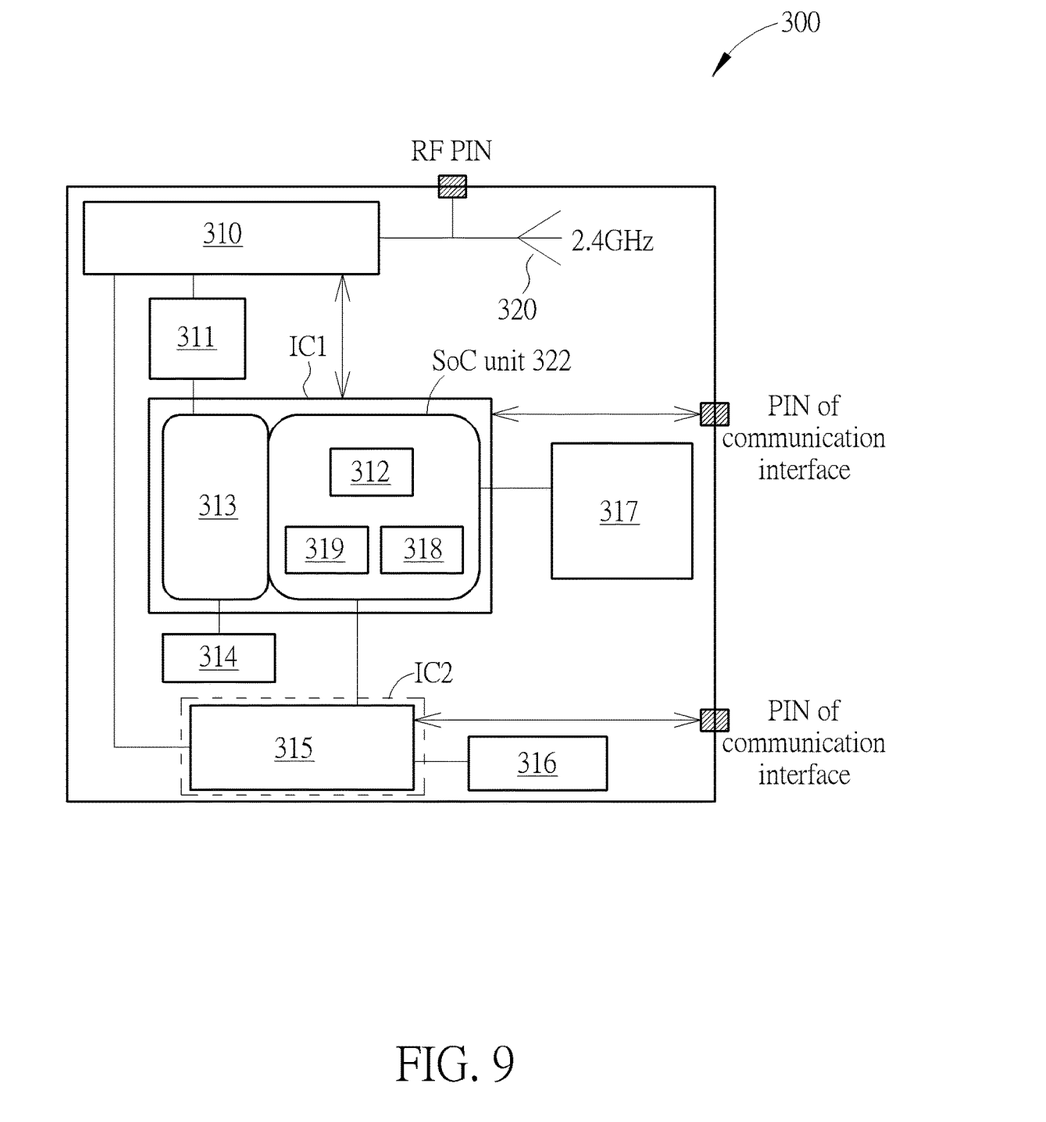
FIG. 9 illustrates a schematic block diagram of a wireless package according to various embodiments of the invention.

An exemplary wireless circuit is illustrated in FIG. 9. FIG. 9 illustrates a schematic block diagram of a wireless package 300 (i.e., the application can be communication device).

As shown in FIG. 9, the wireless package 300 may include a radio frequency (RF) switch 310. Specifically, in this embodiment, two heterogeneous wireless signals or RF signals (i.e., Bluetooth and Wi-Fi signals) are transmitted or received by a common antenna 320 through RF switch 310. In other embodiment, when the two heterogeneous wireless signals are respectively transmitted or received by two antennas, the RF switch 310 can be omitted.

The wireless package 300 further includes a Balun 311. In the embodiment, a Balun 311 is used for transformation between balanced and un-balanced signal. When an LVDS (Low-voltage differential signaling) signal is used by the integrated circuit of wireless package 300, the Balun 311 is required to transform the LVDS signal to a single signal.

The wireless package 300 may further include SOC (System on Chip) unit 322 (it can also be an MCU) having a processor 312, an internal volatile memory 318 and an internal non-volatile memory 319. Particularly, the processor 312 is integrated on the SOC unit 322 of the wireless system package 300. For example, the SOC unit 322 includes the processor 312 (ARM Cortex M0 CPU with low power consumption), an internal volatile memory 318, an internal non-volatile memory 319.

The wireless package 300 may further include a Bluetooth module 313, a first oscillator 314, a Wi-Fi (Wireless Fidelity) module 315, a second oscillator 316, an external non-volatile memory 317 and an antenna 320. Specifically, the wireless package 300 has the RF pin for inspecting radio frequency (RF) signal. The first oscillator 314 is used for generating a first clock (i.e., for example, 32 MHz).

The Bluetooth module 313 is coupled to the first oscillator 314 for processing a Bluetooth signal according to the first clock. As known, a clock signal provided from external is processed by a clock unit on the integrated circuit (IC). For example, signal dividing process, signal phase-locked loop (PLL) process, signal frequency multiplier process. After the clock signal is processed, the processed clock signal can be used to each components of IC. In the embodiment, the first oscillator 314 generates a first clock.

The first clock is further processed by a clock unit on the integrated circuit (i.e., IC1). Then, the processed first clock can be used to the components of integrated circuit IC1 so that the processor 312, Bluetooth unit 313, internal volatile memory 318, internal non-volatile memory 319 can be operated according to a timing sequence of the first clock. The second oscillator 316 is used for generating a second clock (i.e., for example, 26 MHz).

In the embodiment, the first oscillator 314 and the second oscillator 316 are internal individually. However, the present invention is not limited by the internal oscillators. For example, the first oscillator 314 and the second oscillator 316 in other embodiment are built-in components on the SOC unit 322 of an IC1 and an IC2, respectively. RFIC chip may include the Bluetooth module 313 or Wi-Fi module 315.

The Wi-Fi module 315 is coupled to the second oscillator 316 for processing a Wi-Fi signal according to the second clock. The antenna 320 is coupled to the Bluetooth module 313 and the Wi-Fi module 315 for transmitting and receiving a RF signal (wireless signal) through the RF switch 310. The processor 312 is coupled to the Bluetooth module 313 and the Wi-Fi module 315 for controlling the Bluetooth module 313 and the Wi-Fi module 315.

The Balun 311 is coupled to the RF switch 310 for performing a transformation between a balanced signal and an unbalanced signal. The external non-volatile memory 317 is coupled to the processor 312 for providing an external memory capacity through bus, for example, SPI (Serial Peripheral Interface Bus).

In the wireless package 300, the RF switch 310 is coupled to the antenna 320 for controlling the time intervals of transmission between the Wi-Fi signal and the Bluetooth signal. For example, the RF switch 310 may use a time-division duplexing (TDD) method to alternatively access the Wi-Fi signal and the Bluetooth signal. The processor 312 can be any types of programmable logical unit, such as Cortex-M0 typed micro-control unit, logical chip, or central processing unit (CPU). Particularly, the CPU can execute programming, that can perform reallocated hardware (i.e., re-programmable), such as FPGA.

The processor 312 is incorporated on SoC unit 322 that includes the internal volatile memory 318 and internal non-volatile memory 319. The internal volatile memory 318 may be a static random access memory (SRAM) or dynamic random access memory (DRAM) with a first memory capacity (i.e., for example, 16 KB). The internal non-volatile memory 319 may be an internal flash memory with a second memory capacity (i.e., for example, 256 KB).

The Bluetooth module 313 is manufactured according to a specific Bluetooth standard, such as Bluetooth 4.0 standard or Bluetooth LE (Low Energy). The Wi-Fi module 315 is manufactured according to a specific Wi-Fi standard such as 802.11 a/b/g/n/ac Wi-Fi protocol with TCP/IP security stack. The external non-volatile memory 317 can be a plug-in memory or an external memory with a larger memory capacity than the internal non-volatile memory 319 and the internal volatile memory 318. For example, the external non-volatile memory 317 may be a flash memory with a capacity of 1 MB for saving Wi-Fi and/or Bluetooth firmware and Real Time Operation System (RTOS). The RTOS can execute application program.

Specifically, the Wi-Fi and/or Bluetooth firmware is regarded as image loading data for driving the Bluetooth module 313 and/or the Wi-Fi module 315. In the wireless package 300, the Bluetooth module 313 and the SOC unit 322 can be integrated to an IC1 (same chip). However, the present invention is not limited by integrating the Bluetooth module 313 and the SoC unit 322 to the IC1. For example, in another embodiment, the Bluetooth module 313 and the SOC unit 322 are discrete in two separate integrated circuits.

Figure 3:
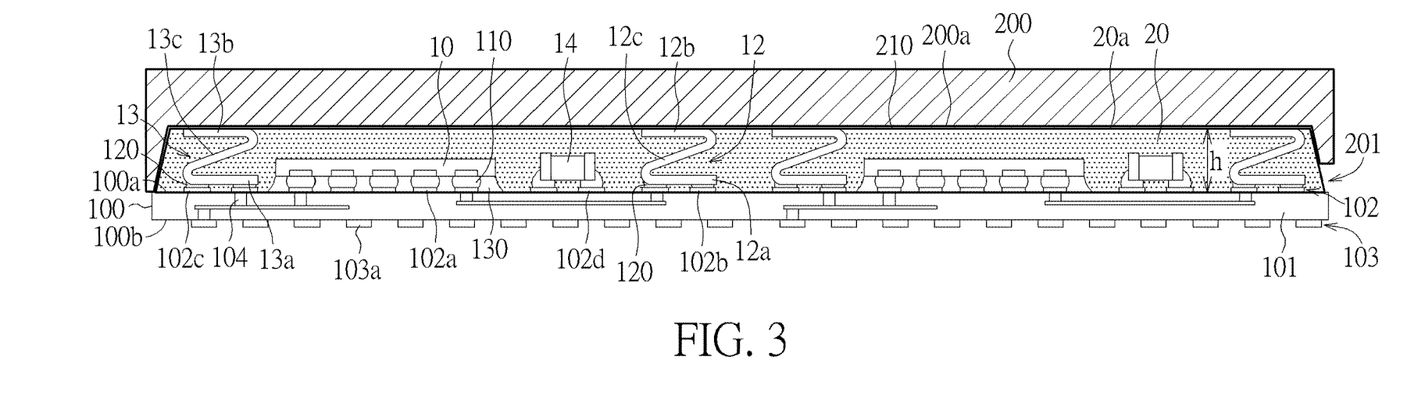

Subsequently, as shown in FIG. 3, a molding process is performed to encapsulate the RFIC chip 10, the resilient connectors 12, 13, the passive device 14, and the top surface 100a of the package substrate 100 with a molding compound 20. An upper mold die 200 covers the package substrate 100 and the elements mounted on the package substrate 100 to form a cavity there between. Encapsulation material such as epoxy resin is injected into the cavity through an inlet 201.

During the molding process, an inner surface 200a of the upper mold die 200 is in direct contact with the top surfaces of the horizontal contact portions 12b and 13b. The upper mold die 200 downwardly compresses the Z shaped resilient connectors 12 and 13 such that the compressed Z shaped resilient connectors 12 and 13 has a height that is substantially equal to the target height h.

According to the embodiment, the molding compound 20 may comprise polymers, epoxy resins, or suitable fillers, but is not limited thereto. The molding compound 20 may be subjected to a curing process.

The molding process may be selected from the group consisting of transfer molding, injection molding, compression molding, liquid molding, and spray molding. The transfer molding, injection molding, and compression molding have relatively higher precision and are suited for the fabrication of smaller module or small-size multi-module. The liquid molding and spray molding have relatively lower precision and flatness, and are suited for the fabrication of large module or large-size multi-module. The later induces smaller stress on the module and is therefore suited for packaging fragile devices such as thin or low profile bare die.

The molding compound 20 has a top surface 20a that is substantially flush with top surfaces of the horizontal contact portions 12b, 13b. The exposed at least one portion of top surfaces of the horizontal contact portions 12b, 13b are used as contact surfaces for the antenna to be formed on the top surface 20a of the molding compound 20. By providing such configuration, the contact resistance between the jumper and the conformal antenna pattern can be reduced and the production yield can be improved.

Optionally, a laser process, a polishing process, or a cleaning process may be performed to remove the residual polymer or undesired substances from the top surfaces of the horizontal contact portions 12b, 13b. Optionally, during the molding process, an adhesive or release layer 210 may be formed on the inner surface 200a of the upper mold die 200 to reduce residual substances.

As can be seen in FIG. 3, the resilient connectors 12, 13, are slightly compressed by the upper mold die 200 during the molding process and have a height that is equal to the height h of the molding compound 20. After the compression of the resilient connectors 12, 13 by the upper mold die 200, the encapsulation material is injected into the cavity through the inlet 201. It is understood that the inlet 201 may be provided at a sidewall of the upper mold die or may be provided elsewhere, for example, on the top side of the upper mold die.

After the encapsulation material completely fills the cavity and the molding compound 20 is cured, the upper mold die 200 and the release layer 210 is removed to expose top surfaces of the horizontal contact portions 12b, 13b, which are used as contact surfaces for the antenna to be formed on the top surface 20a of the molding compound 20.

Subsequently, as shown in FIG. 4, an antenna 30 is formed on the top surface 20a of the molding compound 20. The antenna 30 is a conformal antenna layer. The antenna 30 is in direct contact with the top surfaces of the horizontal contact portions 12b, 13b. The antenna 30 may comprise copper or copper alloy and may be formed by using printing, deposition, plating, or any suitable methods. For example, before printing the antenna pattern, a laser engraving process may be performed to etch a recessed area wherein the antenna pattern is to be printed. A metal paste is then printed into the recessed area to form the antenna pattern.

As shown in FIG. 5, a plurality of solder balls 40 is then mounted on the bottom surface 100b of the package substrate 100, thereby completing the wireless package 1. The solder balls 40 are disposed on the respective contact pads 103a. It is understood that a solder mask (not explicitly shown) may be formed on the bottom surface 100b of the package substrate 100.

According to the embodiment, a dicing process may be performed to separate individual wireless packages from one another. The dicing process involves the use of a blade or dicing saw to cut the multi-module along the dicing streets.

As shown in FIG. 6, the wireless package 1 may be mounted onto a system board or a printed circuit board (PCB) 11 for application.

According to one embodiment, as shown in the partial enlarged view of the resilient connector 12 in FIG. 6, the horizontal contact portion 12b or the lower terminal 12a may further comprise a recessed structure 128. The recessed structure 128 may comprise an interlocking surface 128a that is lower than the top surface 20a of the molding compound 20. The molding compound 20 may fill into the recessed structure 128 to cover the interlocking surface 128a, thereby forming an interlocking feature between the molding compound 20 and the horizontal contact portion 12b of the resilient connector 12.

Figure 8:
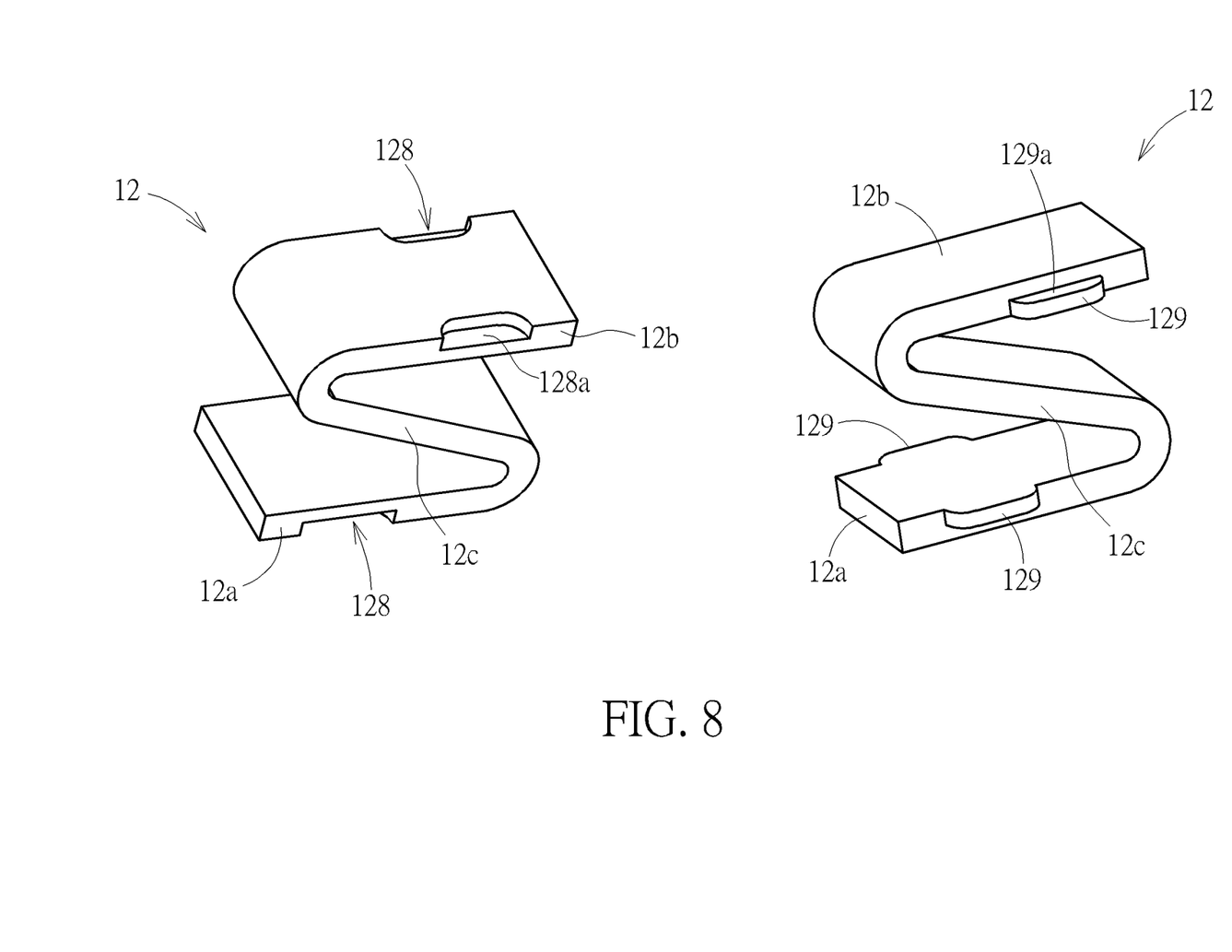
FIG. 8 shows perspective views of exemplary Z shaped resilient connectors according to various embodiments of the invention.

FIG. 8 shows perspective views of two exemplary Z shaped resilient connectors according to various embodiments of the invention. As shown in FIG. 8, the resilient connector 12, as previously mentioned, may comprise a recessed structure 128 and an interlocking surface 128a in the horizontal contact portion 12b or the lower terminal 12a. Alternatively, the resilient connector 12 may comprise a protruding portion 129 laterally extending from a sidewall of the horizontal contact portion 12b or the lower terminal 12a to form an interlocking surface 129a on the protruding portion 129.

The horizontal contact portion 12b and the lower terminal 12a may both comprise such recessed structure 128 or protruding portion 129 such that there is no need to consider the polarities of the Z shaped resilient connectors 12, 13 when disposing the Z shaped resilient connectors 12, 13 on the contact pads 102b, thereby improving the efficiency of the production process.

According to one embodiment, a wireless package is disclosed in FIG. 5. The wireless package 1 includes a package substrate 100 having a top surface 100a and a bottom surface 100b, an RFIC chip 10 mounted on the top surface 100a of the package substrate 100, at least one resilient connector 12, 13 mounted on the top surface 100a of the package substrate 100, a molding compound 20 encapsulating the RFIC chip 10, the resilient connector 12, 13, and the top surface 100a of the package substrate 100, and a conformal antenna 30 disposed on a top surface 20a of the molding compound 20.

A plurality of solder balls may be mounted on the bottom surface 100b of the package substrate 100. A passive device 14 may be mounted on the top surface 100a of the package substrate 100. The passive device 14 may comprise a resistor, a capacitor, or an inductor.

The resilient connector 12, 13 has a lower terminal 12a, 13a bonded to a pad 102b, 102c on the top surface 100a of the package substrate 100, a horizontal contact portion 12b, 13b, and an oblique support portion 12c, 13c being integrally coupled to the horizontal contact portion 12b, 13b and extending between the horizontal contact portion 12b, 13b and the lower terminal 12a, 13a. The antenna 30 is in direct contact with the horizontal contact portion 12b, 13b.

According to the embodiment, a top surface of the horizontal contact portion 12b, 13b is substantially flush with the top surface 20a of the molding compound 20. According to the embodiment, the resilient connector 12, 13 has a Z shaped cross-sectional profile. According to another embodiment, the resilient connector 12, 13 has a/shaped cross-sectional profile. The resilient connector 12, 13 is made of a metal, for example, copper, in a monolithic piece. According to the embodiment, nickel and tin may be plated on the resilient connector 12, 13. By providing such configuration, the contact resistance between the jumper and the conformal antenna pattern can be reduced and the production yield can be improved.

Figure 10:
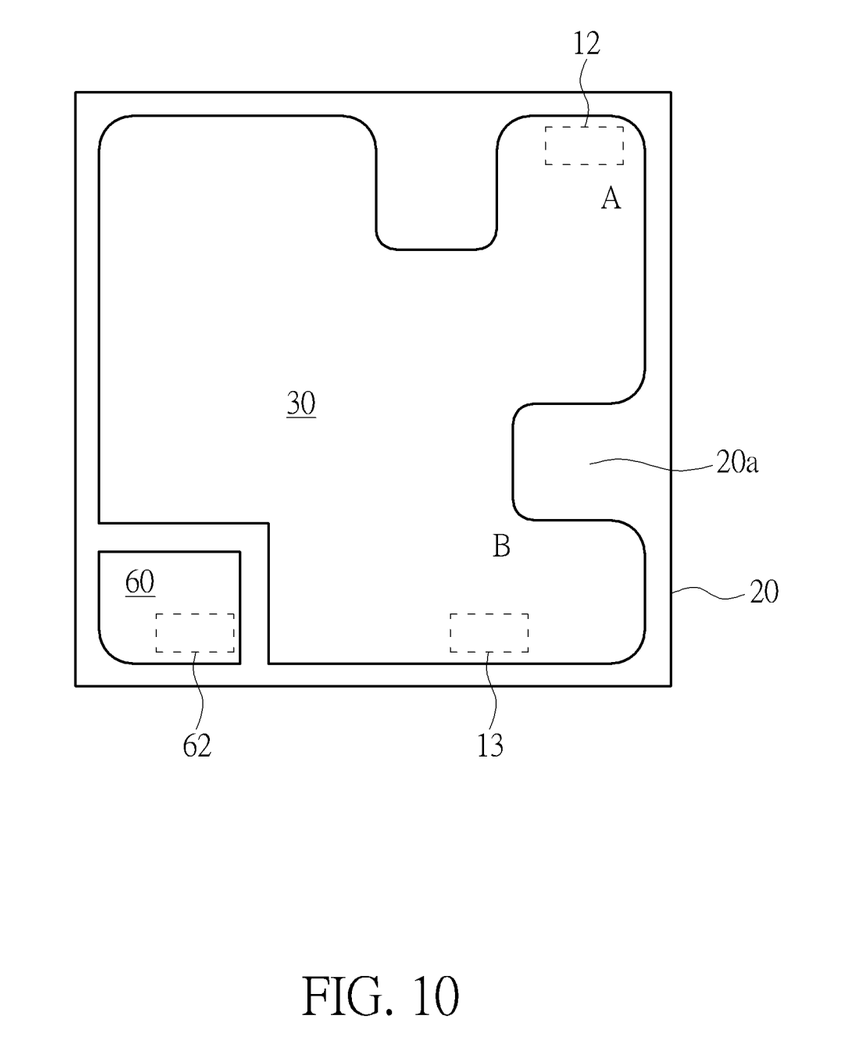
FIG. 10 is a schematic top view showing an exemplary layout of the antenna and the location of the jumpers.
Figure 11:
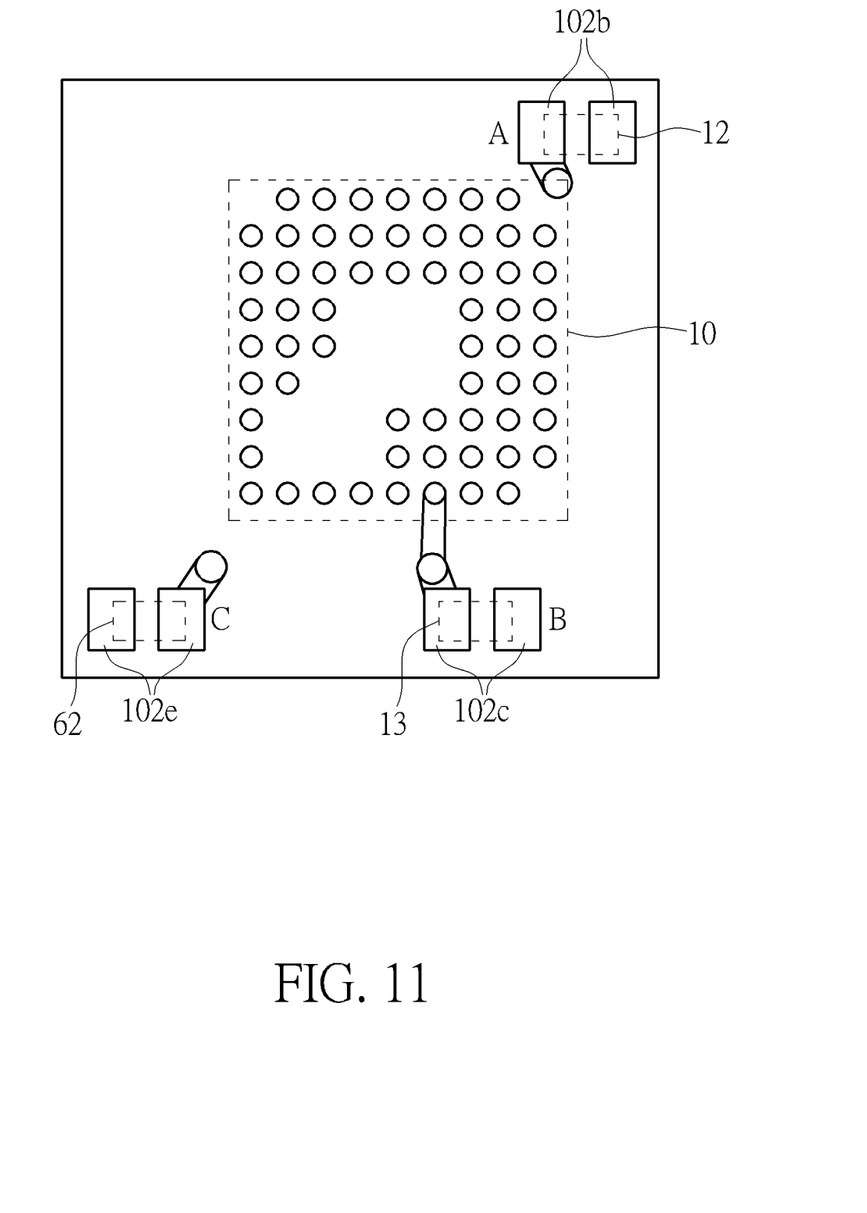
FIG. 11 is a perspective view showing the layout of the first patterned metal layer including the contact pads for the jumpers on the top surface of the package substrate.
Figure 12:
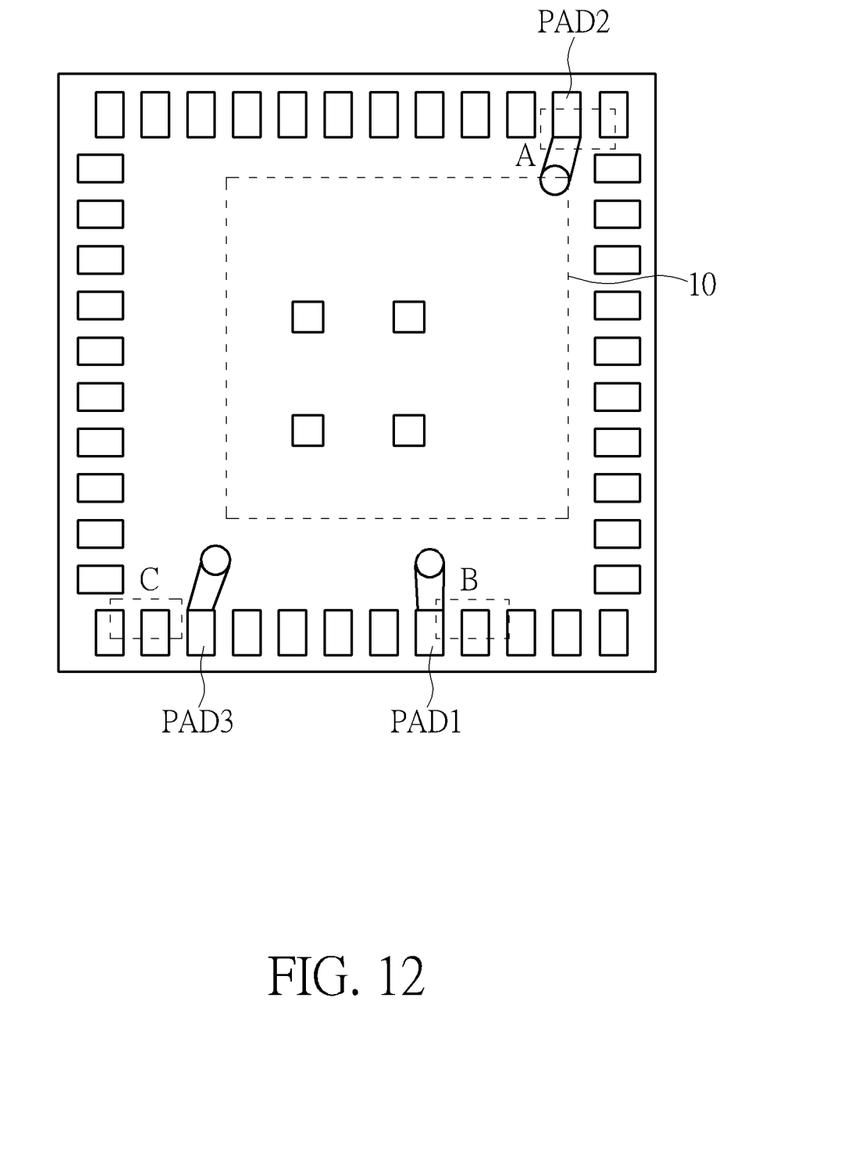
FIG. 12 is a schematic layout diagram of the solder pad arranged at the bottom surface of the package substrate.

Please refer to FIG. 10 to FIG. 12. FIG. 10 to FIG. 12 are schematic layout diagrams of the wireless package in different layers. FIG. 10 is a schematic top view showing an exemplary layout of the antenna 30 and the location of the Z shaped resilient connectors (jumpers) 12, 13. FIG. 11 and FIG. 12 are perspective views showing partial layout, vias, pads and jumpers. In FIG. 11, the layout of the first patterned metal layer 102 including the contact pads for the jumpers on the top surface 100a of the package substrate 100. In FIG. 12, the solder pads are arranged at the bottom surface 100b of the package substrate 100 from top view.

As shown in FIG. 10, the antenna 30 is electrically connected to the top surface of the horizontal contact portion 12b at point A and is electrically connected to the top surface of the horizontal contact portion 13b at point B. According to the embodiment, a conformal electromagnetic (EM) shielding 60 may be provided in close proximity to the antenna 30, for example, at the corner of the wireless package. The EM shielding 60 may be electrically connected to a grounded resilient connector 62 located at point C (there was no overlap between the EM shielding 60 and the antenna 30 in top view of wireless package). As shown in FIG. 11, the bottom terminal of the grounded resilient connector 62 is bonded to a ground pad 102e. According to the embodiment, the EM shielding 60 is not in direct contact with the antenna 30.

According to the embodiment, as shown in FIG. 10 to FIG. 12, PAD2 (ground) is electrically connected to a ground pad 102b of the package substrate 100. The resilient connector 12, which is located at point A, electrically connects the ground pad 102b to the short terminal of the antenna 30. PAD1 (RF pin out) is electrically connected to the RF pad 102c of the package substrate 100. The resilient connector 13, which is located at point B, electrically connects the RF pad 102c to the feeding terminal of the antenna 30. The EM shielding 60 is electrically connected to a grounded resilient connector 62 located at point C. The bottom terminal of the grounded resilient connector 62 is bonded to a ground pad 102e. The EM shielding 60 attenuates the electromagnetic interference to the devices mounted under the EM shielding 60. PAD3 is electrically connected to the ground pad 102e of the package substrate 100.

Compared to the wire bonding technique, during the molding process, the resilient connectors deform due to the pressure exerted by the upper mold die. The correspondence between the horizontal shift and the pressure can be easily estimated. Therefore, the resilient connectors can be precisely aligned with the antenna. For example, the Σ shaped or Z shaped resilient connector has small horizontal shift during the molding process. Further, each horizontal contact portion has a top surface that is electrically connected to the antenna. When the modules are in mass production, these technical features can make the resistance distribution be concentrated.

Figure 13:
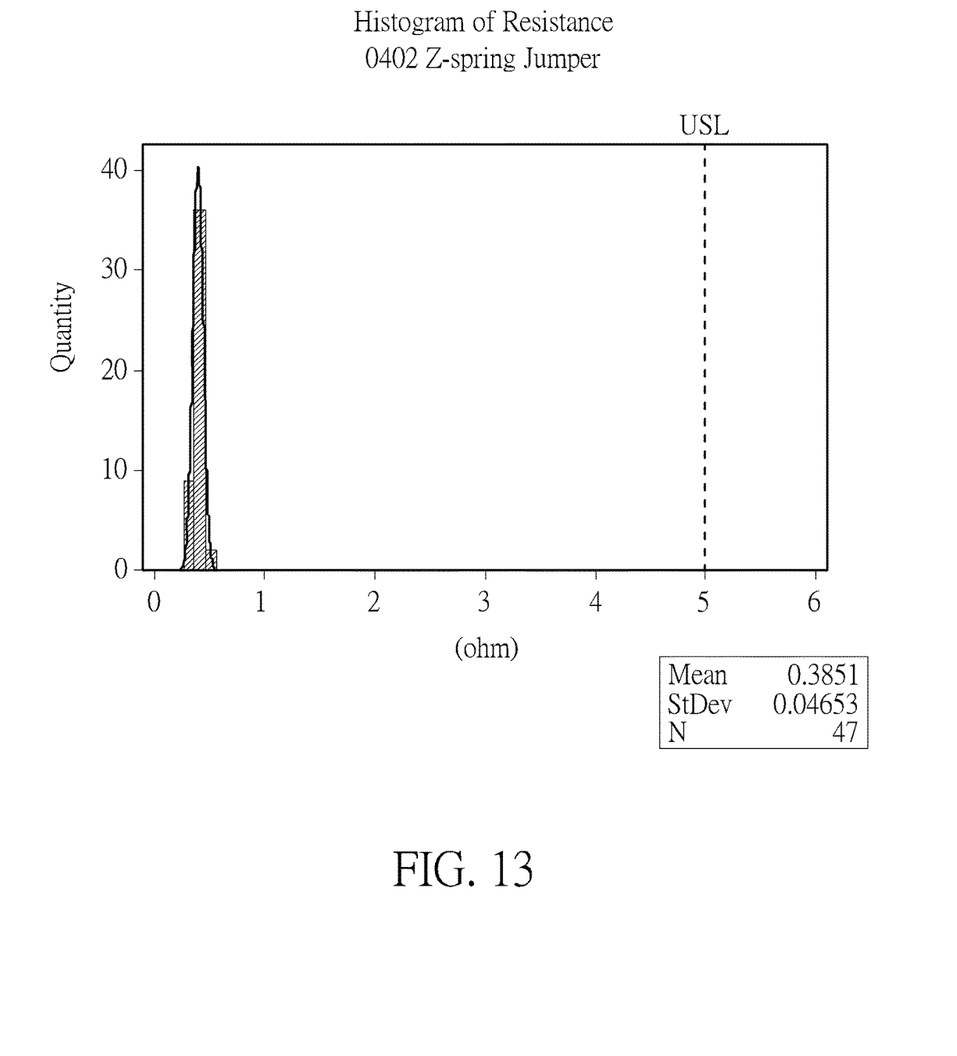
FIG. 13 illustrates a Histogram of Resistance (frequency vs. resistance) for an exemplary Z shaped resilient connector.

FIG. 13 illustrates a Histogram of Resistance (quantity vs. resistance) for an exemplary Z shaped resilient connector. As shown in FIG. 13, the resistance is concentrated and is stable. Deviation of the contact resistance distribution is lower than prior art so that the production yield can be improved. The dimension of the exemplary Z shaped resilient connector may include a length of 1.00±10% mm, a width of 0.50±10% mm, and a height of greater than 0.7 mm (depending upon the depth of the mold chase). The resilient connector is a monolithic structure by bending a side downwardly or upwardly. Such monolithic structure of the resilient connectors has more stable contact resistance and more concentrated contact resistance distribution when the resilient connector deforms.

To avoid the mold wire sweep, it is typically required that the loop height to wire length ratio is smaller than 0.5 and lager width between two bonding pads. However, this hinders the miniaturization of the module. It is advantageous to use the present invention because the resilient connector has a height to width ratio that is greater than 0.5 and larger width of lower terminal, therefore the size of the module can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wireless package, comprising:
   a package substrate having a top surface and a bottom surface;
   at least one radio-frequency integrated circuit (RFIC) chip mounted on the top surface of the package substrate;
   a first resilient connector mounted on the top surface of the package substrate, wherein the first resilient connector has a terminal bonded to a bond pad on the top surface of the package substrate, a horizontal contact portion, and an oblique support portion being integrally coupled to the horizontal contact portion and extending between the horizontal contact portion and the terminal;
   a molding compound encapsulating the at least one RFIC chip, the at least one first resilient connector, and the top surface of the package substrate, wherein the horizontal contact portion further comprises an interlocking surface that is lower than a top surface of the molding compound, wherein the molding compound covers the interlocking surface, thereby forming an interlocking feature between the molding compound and the horizontal contact portion of the first resilient connector; and
   an antenna directly disposed on the top surface of the molding compound and being in direct contact with a flat top surface of the horizontal contact portion, wherein the horizontal contact portion further comprises a recessed structure that is recessed into a sidewall of the horizontal contact portion to form the interlocking surface on the recessed structure.

2. The wireless package according to claim 1 further comprising an electromagnetic (EM) shielding connected to a ground pad on the top surface of the package substrate through a second resilient connector, wherein the EM shielding does not overlap with the antenna in top view of the wireless package.

3. The wireless package according to claim 1, wherein the at least one RFIC chip is mounted on the top surface of the package substrate by wire bonding or flip-chip bonding.

4. The wireless package according to claim 1, wherein the terminal is bonded to the bond pad through a solder.

5. The wireless package according to claim 1, wherein the antenna is a conformal antenna layer.

6. The wireless package according to claim 1, wherein the interlocking surface is in parallel with the flat top surface.

7. The wireless package according to claim 1 further comprising a plurality of solder balls mounted on the bottom surface of the package substrate.

8. The wireless package according to claim 1 further comprising a passive device mounted on the top surface of the package substrate, wherein the passive device is coupled to the at least one RFIC chip to form a wireless circuit.

9. The wireless package according to claim 1, further comprising a vertical sidewall extending between the flat top surface and the interlocking surface.

10. The wireless package according to claim 1, wherein the flat top surface of the horizontal contact portion is coplanar with the top surface of the molding compound.

11. The wireless package according to claim 1, wherein the horizontal contact portion is in parallel with the terminal.

12. The wireless package according to claim 1, wherein the horizontal contact portion is a flat pad structure that is extended horizontally from a bend between the horizontal contact portion and the oblique support portion, and wherein an entire top surface of the flat pad structure is directly and planarly in contact with the antenna.

13. The wireless package according to claim 12, wherein a dimension of the first resilient connector comprises a height/length ratio that is greater than 0.7, and a height/width ratio that is greater than 1.4.

14. The wireless package according to claim 1, wherein the flat top surface of the horizontal contact portion is flush with the top surface of the molding compound.

* * * * *